United States Patent
Gray et al.

(10) Patent No.: US 8,763,254 B2
(45) Date of Patent: Jul. 1, 2014

(54) REINFORCEMENTS, BAFFLES AND SEALS WITH MALLEABLE CARRIERS

(75) Inventors: Todd Gray, Troy, MI (US); Thomas L. Coon, Lapeer, MI (US); Matthew Thomas, Imlay City, MI (US)

(73) Assignee: Zephyros, Inc., Romeo, MI (US)

( * ) Notice: Subject to any disclaimer, the term of this patent is extended or adjusted under 35 U.S.C. 154(b) by 347 days.

(21) Appl. No.: 13/298,901

(22) Filed: Nov. 17, 2011

(65) Prior Publication Data
US 2012/0060352 A1 Mar. 15, 2012

Related U.S. Application Data

(60) Continuation of application No. 12/823,514, filed on Jun. 25, 2010, now Pat. No. 8,079,146, which is a division of application No. 11/461,557, filed on Aug. 1, 2006, now Pat. No. 7,926,179.

(60) Provisional application No. 60/705,561, filed on Aug. 4, 2005.

(51) Int. Cl.
*B21D 53/88* (2006.01)

(52) U.S. Cl.
USPC ..... 29/897.2; 264/46.7; 277/316; 296/187.02

(58) Field of Classification Search
USPC .......... 29/897.2; 296/187.02, 193.01, 193.02; 264/46.4, 46.6, 46.7, 45.4; 277/316
See application file for complete search history.

(56) References Cited

U.S. PATENT DOCUMENTS

| | | | |
|---|---|---|---|
| 3,400,182 A | 9/1968 | Kolt | |
| 3,615,974 A | 10/1971 | Graff | |
| 3,649,375 A | 3/1972 | Venkatesan | |
| 3,868,796 A | 3/1975 | Bush | |
| 4,463,870 A | 8/1984 | Coburn, Jr. et al. | |
| 4,610,836 A | 9/1986 | Wycech | |
| 4,707,397 A | 11/1987 | Morimura et al. | |
| 4,751,249 A | 6/1988 | Wycech | |
| 4,769,391 A | 9/1988 | Wycech | |
| 4,810,548 A * | 3/1989 | Ligon et al. ............. | 428/71 |
| 4,813,690 A | 3/1989 | Coburn, Jr. | |
| 4,822,011 A | 4/1989 | Goldbach et al. | |
| 4,836,516 A | 6/1989 | Wycech | |
| 4,853,270 A | 8/1989 | Wycech | |
| 4,861,097 A | 8/1989 | Wycech | |

(Continued)

FOREIGN PATENT DOCUMENTS

| | | |
|---|---|---|
| DE | 42 26 988 | 2/1994 |
| DE | 198 12 288 C1 | 2/1998 |

(Continued)

OTHER PUBLICATIONS

Born et al., Structural Bonding in Automotive Applications.

(Continued)

*Primary Examiner* — David Bryant
*Assistant Examiner* — Christopher M Koehler
(74) *Attorney, Agent, or Firm* — The Dobrusin Law Firm, PC

(57) ABSTRACT

There is disclosed a process of forming reinforcements, baffles and seals having malleable carriers. The process typically includes application of an activatable material to a malleable carrier and contouring of the activatable material the malleable carrier or both.

21 Claims, 6 Drawing Sheets

(56) References Cited

U.S. PATENT DOCUMENTS

| | | |
|---|---|---|
| 4,901,500 A | 2/1990 | Wycech |
| 4,923,902 A | 5/1990 | Wycech |
| 4,978,562 A | 12/1990 | Wycech |
| 5,124,186 A | 6/1992 | Wycech |
| 5,213,391 A | 5/1993 | Takagi |
| 5,288,538 A | 2/1994 | Spears |
| 5,344,208 A * | 9/1994 | Bien et al. ............... 296/187.02 |
| 5,358,397 A | 10/1994 | Ligon et al. |
| 5,506,025 A | 4/1996 | Otto et al. |
| 5,575,526 A | 11/1996 | Wycech |
| 5,631,027 A | 5/1997 | Takabatake |
| 5,642,914 A * | 7/1997 | Takabatake ............... 296/187.02 |
| 5,725,272 A | 3/1998 | Jones |
| 5,755,486 A | 5/1998 | Wycech |
| 5,766,719 A * | 6/1998 | Rimkus ............... 428/71 |
| 5,806,915 A * | 9/1998 | Takabatake ............... 296/187.02 |
| 5,888,600 A | 3/1999 | Wycech |
| 5,904,024 A * | 5/1999 | Miwa ............... 52/309.1 |
| 5,932,680 A | 8/1999 | Heider |
| 5,985,435 A | 11/1999 | Czaplicki et al. |
| 5,992,923 A | 11/1999 | Wycech |
| 5,997,077 A | 12/1999 | Siebels et al. |
| 6,003,274 A | 12/1999 | Wycech |
| 6,006,484 A | 12/1999 | Geissbuhler |
| 6,033,300 A | 3/2000 | Schneider |
| 6,068,424 A | 5/2000 | Wycech |
| 6,079,180 A | 6/2000 | Wycech |
| 6,092,864 A | 7/2000 | Wycech et al. |
| 6,093,358 A * | 7/2000 | Schiewe et al. ............... 264/250 |
| 6,096,403 A | 8/2000 | Wycech et al. |
| 6,099,948 A * | 8/2000 | Paver, Jr. ............... 428/304.4 |
| 6,103,341 A | 8/2000 | Barz et al. |
| 6,131,897 A | 10/2000 | Barz et al. |
| 6,146,565 A * | 11/2000 | Keller ............... 264/46.5 |
| 6,149,227 A | 11/2000 | Wycech |
| 6,150,428 A | 11/2000 | Hanley, IV et al. |
| 6,165,588 A | 12/2000 | Wycech |
| 6,168,226 B1 | 1/2001 | Wycech |
| 6,189,953 B1 | 2/2001 | Wycech |
| 6,196,621 B1 * | 3/2001 | VanAssche et al. ..... 296/187.09 |
| 6,199,940 B1 | 3/2001 | Hopton et al. |
| 6,207,244 B1 | 3/2001 | Hesch |
| 6,233,826 B1 | 5/2001 | Wycech |
| 6,237,304 B1 | 5/2001 | Wycech |
| 6,247,287 B1 * | 6/2001 | Takabatake ............... 52/843 |
| 6,253,524 B1 * | 7/2001 | Hopton et al. ............... 52/843 |
| 6,263,635 B1 | 7/2001 | Czaplicki |
| 6,270,600 B1 | 8/2001 | Wycech |
| 6,272,809 B1 | 8/2001 | Wycech |
| 6,276,105 B1 | 8/2001 | Wycech |
| 6,281,260 B1 | 8/2001 | Hanley, IV et al. |
| 6,287,666 B1 | 9/2001 | Wycech |
| 6,296,298 B1 | 10/2001 | Barz |
| 6,305,136 B1 * | 10/2001 | Hopton et al. ............... 52/309.7 |
| 6,311,452 B1 | 11/2001 | Barz et al. |
| 6,315,938 B1 | 11/2001 | Jandali |
| 6,319,964 B1 | 11/2001 | Blank et al. |
| 6,321,793 B1 | 11/2001 | Czaplicki et al. |
| 6,332,731 B1 | 12/2001 | Wycech |
| 6,341,467 B1 | 1/2002 | Wycech |
| 6,358,584 B1 * | 3/2002 | Czaplicki ............... 428/36.5 |
| 6,368,438 B1 | 4/2002 | Chang et al. |
| 6,372,334 B1 | 4/2002 | Wycech |
| D457,120 S | 5/2002 | Broccardo et al. |
| 6,382,635 B1 * | 5/2002 | Fitzgerald ............... 277/630 |
| 6,383,610 B1 | 5/2002 | Barz et al. |
| 6,389,775 B1 | 5/2002 | Steiner et al. |
| 6,406,078 B1 | 6/2002 | Wycech |
| 6,413,611 B1 * | 7/2002 | Roberts et al. ............... 428/99 |
| 6,419,305 B1 | 7/2002 | Larsen |
| 6,422,575 B1 | 7/2002 | Czaplicki et al. |
| 6,455,146 B1 | 9/2002 | Fitzgerald |
| 6,467,834 B1 | 10/2002 | Barz et al. |
| 6,471,285 B1 | 10/2002 | Czaplicki et al. |
| 6,474,722 B2 | 11/2002 | Barz |
| 6,474,723 B2 | 11/2002 | Czaplicki et al. |
| 6,475,577 B1 * | 11/2002 | Hopton et al. ............... 428/34.7 |
| 6,478,367 B2 | 11/2002 | Ishikawa |
| 6,482,486 B1 | 11/2002 | Czaplicki et al. |
| 6,482,496 B1 | 11/2002 | Wycech |
| 6,491,336 B1 | 12/2002 | Beckmann et al. |
| 6,502,821 B2 | 1/2003 | Schneider |
| 6,519,854 B2 * | 2/2003 | Blank ............... 29/897.1 |
| 6,523,857 B1 | 2/2003 | Hopton et al. |
| 6,523,884 B2 | 2/2003 | Czaplicki et al. |
| 6,546,693 B2 | 4/2003 | Wycech |
| 6,561,571 B1 | 5/2003 | Brennecke |
| 6,573,309 B1 | 6/2003 | Reitenbach et al. |
| 6,575,526 B2 | 6/2003 | Czaplicki et al. |
| 6,607,238 B2 * | 8/2003 | Barz ............... 296/187.09 |
| 6,619,727 B1 | 9/2003 | Barz et al. |
| 6,634,698 B2 | 10/2003 | Kleino |
| 6,641,208 B2 | 11/2003 | Czaplicki et al. |
| 6,668,457 B1 | 12/2003 | Czaplicki |
| 6,679,540 B1 | 1/2004 | Graber et al. |
| 6,691,468 B2 | 2/2004 | Helferty |
| 6,692,347 B1 | 2/2004 | Schneider |
| 6,708,979 B2 | 3/2004 | Stratman et al. |
| 6,729,425 B2 | 5/2004 | Schneider |
| 6,748,667 B2 | 6/2004 | Sevastian |
| 6,777,049 B2 | 8/2004 | Sheldon et al. |
| 6,786,533 B2 * | 9/2004 | Bock et al. ............... 296/187.02 |
| 6,793,274 B2 | 9/2004 | Riley et al. |
| 6,811,864 B2 | 11/2004 | Czaplicki et al. |
| 6,820,923 B1 | 11/2004 | Bock |
| 6,846,559 B2 | 1/2005 | Czaplicki et al. |
| 6,851,232 B1 | 2/2005 | Schwegler |
| 6,855,652 B2 | 2/2005 | Hable et al. |
| 6,880,657 B2 | 4/2005 | Schneider et al. |
| 6,887,914 B2 | 5/2005 | Czaplicki et al. |
| 6,890,021 B2 * | 5/2005 | Bock et al. ............... 296/187.02 |
| 6,905,745 B2 | 6/2005 | Sheldon et al. |
| 6,920,693 B2 | 7/2005 | Hankins et al. |
| 6,921,130 B2 | 7/2005 | Barz et al. |
| 6,923,499 B2 | 8/2005 | Wieber et al. |
| 6,928,736 B2 | 8/2005 | Czaplicki et al. |
| 6,932,421 B2 | 8/2005 | Barz |
| 6,938,947 B2 | 9/2005 | Barz et al. |
| 6,941,719 B2 | 9/2005 | Busseuil et al. |
| 6,953,219 B2 | 10/2005 | Lutz et al. |
| 6,955,593 B2 | 10/2005 | Lewis et al. |
| 6,969,551 B2 | 11/2005 | Richardson et al. |
| 7,004,536 B2 | 2/2006 | Wieber |
| 7,011,315 B2 | 3/2006 | Czaplicki et al. |
| 7,025,409 B2 | 4/2006 | Riley et al. |
| 7,041,193 B2 | 5/2006 | Bogert et al. |
| 7,077,460 B2 | 7/2006 | Czaplicki et al. |
| 7,290,828 B2 * | 11/2007 | Kosal et al. ............... 296/187.02 |
| 2001/0040388 A1 * | 11/2001 | Barz ............... 296/187 |
| 2002/0053179 A1 | 5/2002 | Wycech |
| 2002/0074827 A1 | 6/2002 | Fitzgerald et al. |
| 2002/0096833 A1 | 7/2002 | Czaplicki et al. |
| 2002/0174954 A1 | 11/2002 | Busseuil et al. |
| 2003/0001469 A1 | 1/2003 | Hankins et al. |
| 2003/0039792 A1 | 2/2003 | Hable et al. |
| 2003/0050352 A1 | 3/2003 | Guenther et al. |
| 2003/0057737 A1 | 3/2003 | Bock et al. |
| 2003/0062739 A1 | 4/2003 | Bock |
| 2003/0069335 A1 | 4/2003 | Czaplicki et al. |
| 2003/0140671 A1 | 7/2003 | Lande et al. |
| 2003/0176128 A1 | 9/2003 | Czaplicki et al. |
| 2003/0183317 A1 | 10/2003 | Czaplicki et al. |
| 2003/0184121 A1 | 10/2003 | Czaplicki et al. |
| 2003/0201572 A1 | 10/2003 | Coon et al. |
| 2003/0209921 A1 | 11/2003 | Coon et al. |
| 2003/0218019 A1 | 11/2003 | Le Gall et al. |
| 2004/0011282 A1 | 1/2004 | Myers et al. |
| 2004/0018341 A1 | 1/2004 | Richardson et al. |
| 2004/0018353 A1 | 1/2004 | Czaplicki et al. |
| 2004/0034982 A1 | 2/2004 | Wieber et al. |
| 2004/0036317 A1 | 2/2004 | Kleino |
| 2004/0046423 A1 | 3/2004 | Wieber |
| 2004/0056472 A1 | 3/2004 | Schneider |
| 2004/0070232 A1 * | 4/2004 | Mourieras et al. ........ 296/187.02 |

(56) References Cited

U.S. PATENT DOCUMENTS

| | | | |
|---|---|---|---|
| 2004/0074150 A1 | 4/2004 | Wycech | |
| 2004/0076831 A1 | 4/2004 | Hable et al. | |
| 2004/0079478 A1 | 4/2004 | Merz | |
| 2004/0084141 A1 | 5/2004 | Czaplicki | |
| 2004/0112531 A1 | 6/2004 | Bogert et al. | |
| 2004/0124553 A1 | 7/2004 | Czaplicki et al. | |
| 2004/0135058 A1 | 7/2004 | Wycech | |
| 2004/0143969 A1 | 7/2004 | Czaplicki et al. | |
| 2004/0195817 A1 | 10/2004 | Tarbutton et al. | |
| 2004/0212220 A1 | 10/2004 | Riley et al. | |
| 2004/0217626 A1 | 11/2004 | Barz et al. | |
| 2004/0227377 A1 | 11/2004 | Gray | |
| 2004/0256888 A1 | 12/2004 | Le Gall et al. | |
| 2004/0262810 A1 | 12/2004 | Barz et al. | |
| 2004/0262853 A1* | 12/2004 | Larsen et al. | 277/628 |
| 2004/0266898 A1 | 12/2004 | Kassa et al. | |
| 2005/0012280 A1 | 1/2005 | Richardson | |
| 2005/0016807 A1 | 1/2005 | Braymand | |
| 2005/0017543 A1 | 1/2005 | Riley et al. | |
| 2005/0081383 A1* | 4/2005 | Kosal et al. | 29/897.2 |
| 2005/0082111 A1 | 4/2005 | Weber | |
| 2005/0087899 A1 | 4/2005 | Coon et al. | |
| 2005/0102815 A1 | 5/2005 | Larsen | |
| 2005/0126286 A1 | 6/2005 | Hable et al. | |
| 2005/0126848 A1 | 6/2005 | Siavoshai et al. | |
| 2005/0127145 A1 | 6/2005 | Czaplicki et al. | |
| 2005/0159531 A1 | 7/2005 | Ferng | |
| 2005/0166532 A1 | 8/2005 | Barz | |
| 2005/0172486 A1 | 8/2005 | Carlson et al. | |
| 2005/0194706 A1 | 9/2005 | Kosal et al. | |
| 2005/0212326 A1 | 9/2005 | Marion | |
| 2005/0212332 A1 | 9/2005 | Sheldon et al. | |
| 2005/0217785 A1 | 10/2005 | Hable et al. | |
| 2005/0218697 A1 | 10/2005 | Barz et al. | |
| 2005/0230165 A1 | 10/2005 | Thomas et al. | |
| 2005/0241756 A1 | 11/2005 | Harthcock et al. | |
| 2005/0249916 A1 | 11/2005 | Muto et al. | |
| 2005/0251988 A1 | 11/2005 | Mendiboure | |
| 2005/0260399 A1 | 11/2005 | Finerman | |
| 2005/0268454 A1* | 12/2005 | White | 29/592 |
| 2005/0269840 A1 | 12/2005 | Finerman et al. | |
| 2005/0276970 A1 | 12/2005 | Busseuil et al. | |
| 2005/0285292 A1 | 12/2005 | Mendiboure et al. | |
| 2006/0000186 A1 | 1/2006 | Carlson et al. | |
| 2006/0006695 A1 | 1/2006 | Lutz et al. | |
| 2006/0008615 A1 | 1/2006 | Muteau et al. | |
| 2006/0019595 A1 | 1/2006 | Lewis et al. | |
| 2006/0020076 A1 | 1/2006 | Finerman et al. | |
| 2006/0021697 A1 | 2/2006 | Riley et al. | |
| 2006/0043772 A1* | 3/2006 | Richardson | 296/187.02 |
| 2006/0057333 A1* | 3/2006 | Brahim | 428/138 |
| 2006/0061115 A1 | 3/2006 | Brennecke | |
| 2006/0065483 A1 | 3/2006 | Thomas | |
| 2010/0257738 A1 | 10/2010 | Gray et al. | |

FOREIGN PATENT DOCUMENTS

| | | |
|---|---|---|
| DE | 198 56 255 C1 | 3/1998 |
| DE | 198 58 903 A1 | 12/1998 |
| DE | 299 04 705 U1 | 6/1999 |
| EP | 0 236 291 | 9/1987 |
| EP | 0 611 778 | 1/1994 |
| EP | 0 679 501 | 11/1995 |
| EP | 0 697 956 | 2/1996 |
| EP | 0 819 723 | 1/1998 |
| EP | 0 891 918 | 1/1999 |
| EP | 0 893 331 A1 | 1/1999 |
| EP | 0 893 332 A1 | 1/1999 |
| EP | 1 046 666 | 10/2000 |
| EP | 1 072 647 | 1/2001 |
| EP | 1 134 126 | 3/2001 |
| EP | 1 122 152 | 8/2001 |
| EP | 1 122 156 A2 | 8/2001 |
| EP | 1 031 496 | 12/2001 |
| EP | 1 182 087 | 2/2002 |
| EP | 0 893 332 B1 | 3/2002 |
| EP | 0 703 931 | 10/2003 |
| EP | 1 362 683 | 11/2003 |
| EP | 1 362 769 | 11/2003 |
| EP | 1 428 744 | 6/2004 |
| EP | 1 023 413 B1 | 9/2004 |
| EP | 1 134 314 B1 | 9/2004 |
| EP | 1 471 105 | 10/2004 |
| EP | 1 475 295 A2 | 11/2004 |
| EP | 1 299 497 | 12/2004 |
| EP | 1 591 224 | 2/2005 |
| EP | 1 577 190 | 9/2005 |
| EP | 1 458 594 | 3/2006 |
| FR | 2749263 | 12/1997 |
| GB | 2 083 162 | 3/1982 |
| GB | 2 325 509 | 11/1988 |
| GB | 2 375 328 | 11/2002 |
| JP | 406156317 A | 6/1994 |
| JP | 10-45031 | 2/1998 |
| JP | 10053156 | 2/1998 |
| JP | 2001-62833 | 3/2001 |
| JP | 2001-88739 | 4/2001 |
| JP | 2001-199362 | 7/2001 |
| JP | 02001191949 A | 7/2001 |
| JP | 2002-120250 | 4/2002 |
| WO | WO95/32110 | 5/1995 |
| WO | WO97/02967 | 1/1997 |
| WO | WO96/22324 | 5/1997 |
| WO | WO97/43501 | 11/1997 |
| WO | WO98/50221 | 5/1998 |
| WO | WO 99/08854 | 2/1999 |
| WO | WO99/28575 | 6/1999 |
| WO | WO99/48746 | 9/1999 |
| WO | WO99/50057 | 10/1999 |
| WO | WO00/10802 | 3/2000 |
| WO | WO00/13958 | 3/2000 |
| WO | WO00/37302 | 6/2000 |
| WO | WO00/38863 | 7/2000 |
| WO | WO00/40815 | 7/2000 |
| WO | WO00/43254 | 7/2000 |
| WO | WO00/46461 | 8/2000 |
| WO | WO00/55444 | 9/2000 |
| WO | WO01/10682 | 2/2001 |
| WO | WO01/24989 | 4/2001 |
| WO | WO01/54936 | 8/2001 |
| WO | WO01/71225 | 9/2001 |
| WO | WO01/83206 | 11/2001 |
| WO | WO01/88033 | 11/2001 |
| WO | WO03/042024 | 5/2003 |
| WO | WO03/051676 | 6/2003 |
| WO | WO03/093387 | 11/2003 |
| WO | WO2004/067304 | 8/2004 |
| WO | WO2005/002950 | 1/2005 |
| WO | WO2005/044630 | 5/2005 |
| WO | WO2005/077634 | 8/2005 |
| WO | WO2005/080524 | 9/2005 |
| WO | WO2005/105405 | 11/2005 |
| WO | WO2005/113689 | 12/2005 |
| WO | WO2005/118735 | 12/2005 |

OTHER PUBLICATIONS

Hopton et al., Application of a Structural Reinforcing Material to Improve Vehicle NVH Characteristics.
Lilley et al., Comparison of Preformed acoustic Baffles and Two-Component Polyurethane Foams for Filling Body Cavities.
Lilley et al., A Comparison of NVH Treatments for Vehicle Floorplan Applications.
Lilley et al., Vehicle Acoustic Solutions.
Mansour et al., Optimal Bonding Thickness for Vehicle Stiffness.
Copending U.S. Appl. No. 10/718,509, filed Nov. 20, 2003.
Copending Patent Application Serial No. GB 0220945.0 filed Sep. 10, 2002.
Copending Patent Application Serial No. EP 0300159.1 filed Jan. 6, 2003.
Copending U.S. Appl. No. 11/188,679, filed Jul. 25, 2005.
Copending U.S. Appl. No. 11/189,190, filed Jul. 26, 2005.

(56) References Cited

OTHER PUBLICATIONS

Copending U.S. Appl. No. 11/254,129, filed Oct. 19, 2005.
Copending U.S. Appl. No. 60/753,973, filed Dec. 23, 2005.
Copending U.S. Appl. No. 11/339,431, filed Jan. 25, 2006.
Copending U.S. Appl. No. 11/390,658, filed Mar. 28, 2006.
Copending U.S. Appl. No. 11/391,884, filed Mar. 29, 2006.
Copending U.S. Appl. No. 11,393,535, filed Mar. 30, 2006.
Copending U.S. Appl. No. 11/393,431, filed Mar. 30, 2006.
Copending U.S. Appl. No. 11/401,207, filed Apr. 10, 2006.
Copending U.S. Appl. No. 11/381,769, filed May 5, 2006.
Copending U.S. Appl. No. 60/746,810, filed May 9, 2006.
Copending U.S. Appl. No. 60/747,677, filed May 19, 2006.
Copending U.S. Appl. No. 60/804,117, filed Jun. 7, 2007.
Copending U.S. Appl. No. 11/422,705, filed Jun. 7, 2006.
Copending U.S. Appl. No. 60/820,295, filed Jul. 25, 2006.
Copending U.S. Appl. No. 10/597,610, filed Aug. 1, 2006.
International Search Report dated Dec. 13, 2006. PCT/US2006/030480.
Kim J H et al., "Effects of Si and C. Additions on the Thermal Stability of Directionally Solidified TiAl-Nb Alloys" Intermetalics, Elsevier Science Publishers B.V. GB, vol. 13, No. 10, 2005, pp. 1038-1047.
Hu D et al., "Phase Transformations in Some TiAl-based Alloys" Jul. 2002, Intermetallics, Elsevier Science Publishers B.V, GB, pp. 701-715.

* cited by examiner

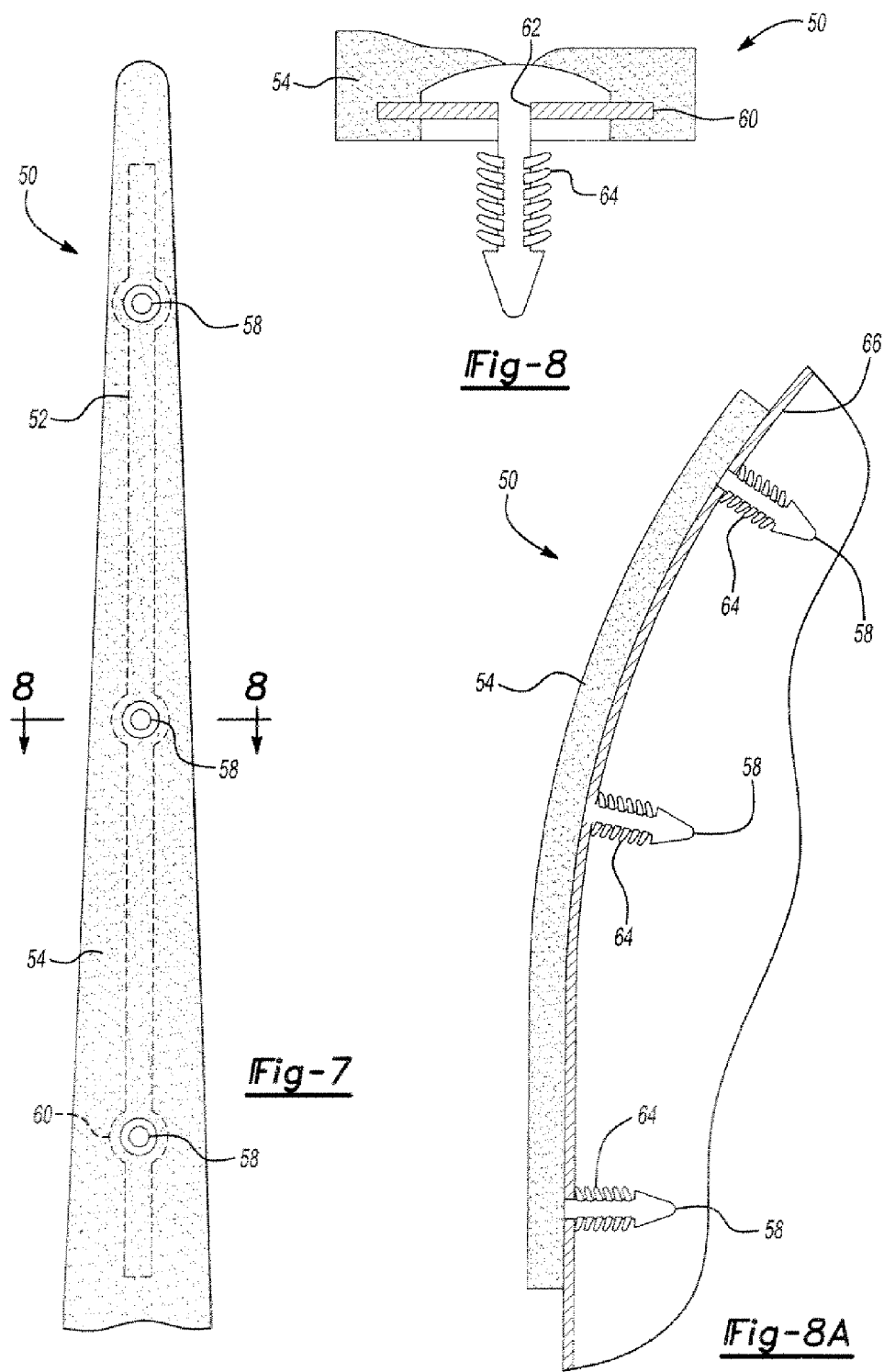

ered to another aspect of the present invention.
REINFORCEMENTS, BAFFLES AND SEALS WITH MALLEABLE CARRIERS

CLAIM OF BENEFIT OF FILING DATE

The present application is a continuation of application Ser. No. 12/823,514 filed on Jun. 25, 2010 now U.S. Pat. No. 8,079,146, which is a divisional of application Ser. No. 11/461,557 filed on Aug. 1, 2006 (now U.S. Pat. No. 7,926,179), which is a non-provisional of application Ser. No. 60/705,561 filed Aug. 4, 2005 and the present application claims the benefit of the filing dates of all prior applications, the contents of which are hereby incorporated by reference in their entirety.

FIELD OF THE INVENTION

The present invention relates generally to a member for providing sealing, baffling, reinforcement or a combination thereof to an article of manufacture such as an automotive vehicle.

BACKGROUND OF THE INVENTION

For many years, industry and particularly the transportation industry has been concerned with designing members for providing baffling, sealing, structural reinforcement or the like to articles of manufacture such as automotive vehicles. As an example, U.S. Pat. Nos. 5,755,486; 4,901,500; and 4,751,249 describe prior art devices. Generally, the members include carriers with activatable material disposed thereon. Design of such members can involve a variety of factors, which may be adverse to each other. For example, it is generally desirable for such members to be relatively inexpensive. However, the cost of materials and processing for such members can drive costs up, particularly in situations where it is desirable for the members to be shaped to include one or more contours. Thus, the present invention provide a member for reinforcement, baffling or sealing that effectively copes with competing design factors or provides other advantages, which will become apparent from the following description.

SUMMARY OF THE INVENTION

The present invention is directed to a process that provides sealing, baffling, reinforcement or a combination thereof to a structure of an article of manufacture such as an automotive vehicle. According to the process, a malleable carrier member is provided and an activatable material is associated with the malleable carrier thereby forming the member. Preferably, the volume of activatable material is at least 500% of the volume of the malleable carrier. The malleable carrier, the activatable material or both are also shaped according to the process and the shaping step typically includes at least one or a combination of the following: 1) shaping the malleable carrier to a predetermined configuration and molding the activatable material onto the malleable carrier; 2) molding the activatable material upon the malleable carrier for forming the member and applying the member to a structure of an article in a manner that includes shaping the malleable carrier and the activatable material; or 3) disposing the activatable material upon the carrier and bending at least a portion of the carrier to attach the carrier and the activatable material to a structure.

BRIEF DESCRIPTION OF THE DRAWINGS

The features and inventive aspects of the present invention will become more apparent upon reading the following detailed description, claims, and drawings, of which the following is a brief description:

FIG. 7 is a front view of an exemplary member according to an aspect of the present invention.

FIG. 8 is a sectional view of the exemplary member of FIG. 7.

FIG. 8A is a side view of the member of FIGS. 7 and 8 being applied to a substrate.

DETAILED DESCRIPTION OF THE PREFERRED EMBODIMENT

Figure 1:
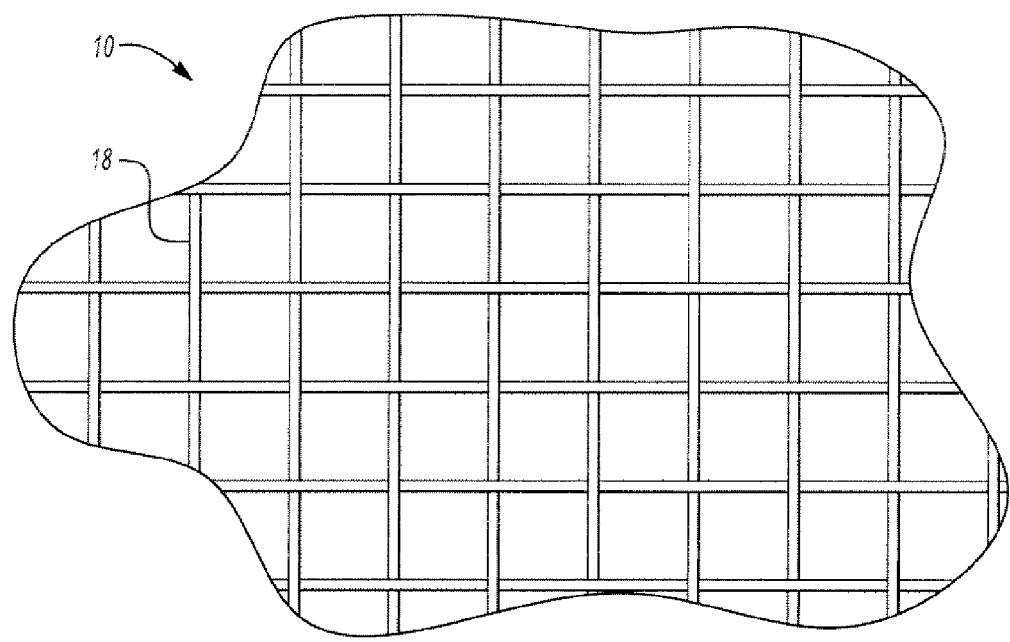
FIG. 1 is a front view of an exemplary carrier material according to an aspect of the present invention.

The present invention is predicated upon the provision of a member suitable for providing sealing, baffling, reinforcement or a combination thereof to one or more structures of an article of manufacture and a process for forming the member and applying the member to the one or more structures of the article of manufacture. Together, the one or more structures and the member form a system or assembly that is generally desirable for the article of manufacture because of the functional attributes (e.g., noise reduction, sealing, strength, combinations thereof or the like) provided by the member. It is contemplated that the member may be employed in conjunction with a variety of structures of various articles of manufacture such as boats, trains, buildings, appliances, homes, furniture or the like. It has been found, however, that the member is particularly suitable for application to structures or assemblies of transportation vehicles such as automotive vehicles. Generally, it is contemplated that the member may be applied to various structures of an automotive vehicle such as components of a body, a frame, an engine, a hood, a trunk, a bumper, combinations thereof or the like of an automotive vehicle.

The member typically includes one or more of the following:
  i) a malleable carrier;
  ii) an activatable material disposed upon the malleable carrier; and
  iii) optionally, one or more fasteners connected to the carrier, the activatable material or both:

The process for forming the member typically include one or more of the following steps:
  i) providing a malleable carrier;
  ii) associating an activatable material with the malleable carrier;

iii) shaping of the activatable material, the malleable carrier material or both; and iv) optionally, connecting one or more fasteners to the activatable material, the carrier or both.

As used herein, the term malleable as it applies to a carrier generally means that the carrier has a degree of pliability that allows the carrier to be shaped or formed. A material that is malleable according to the present invention typically has a yield stress less than about 1000 MPa but may be greater, more typically less than about a 700 MPa, more typically less than about 500 MPa and even more typically less than about 350 MPa, but typically greater than about 10 MPa but may be less, more typically greater than about 70 MPa, even more typically greater than about 100 MPa and still more typically greater than about 250 MPa.

Suitable malleable carrier materials can include, without limitation, polymeric materials (e.g., elastomers, plastics or the like), metals, composite materials, fibrous materials, combinations thereof or the like. Materials including or composed substantially entirely of one or more metals are particularly suitable for use as carrier materials. Exemplary metals include, without limitation, aluminum, steel, iron, magnesium, zinc, lead, tin, titanium, molybdenum, vanadium, zirconium, chromium, copper, tungsten, nickel, silver, gold, platinum, combinations thereof or the like.

Generally, a malleable carrier may be formed in a variety of configurations. In one embodiment, the carrier will be formed of one or more strips of malleable material. As used herein, a strip of material is any configuration of material having an extension length and a maximum diameter wherein the maximum diameter is substantially less than the extension length. For example, the maximum diameter should be less than 20%, more typically less than 10% and even more typically less than 2% and even more typically less than 0.5% of the extension length. The extension length is a length of a strip when the strip is arranged in a substantially straight line and the maximum diameter is a maximum dimension of the strip substantially perpendicular to the length. Thus, for example, a coiled cylindrical wire could be considered a strip if the wire is uncoiled, arranged in a substantially straight line and the maximum diameter of the wire is substantially less than the extension length. Exemplary strips includes wires, coils, straps, combinations thereof or the like.

Figure 2:
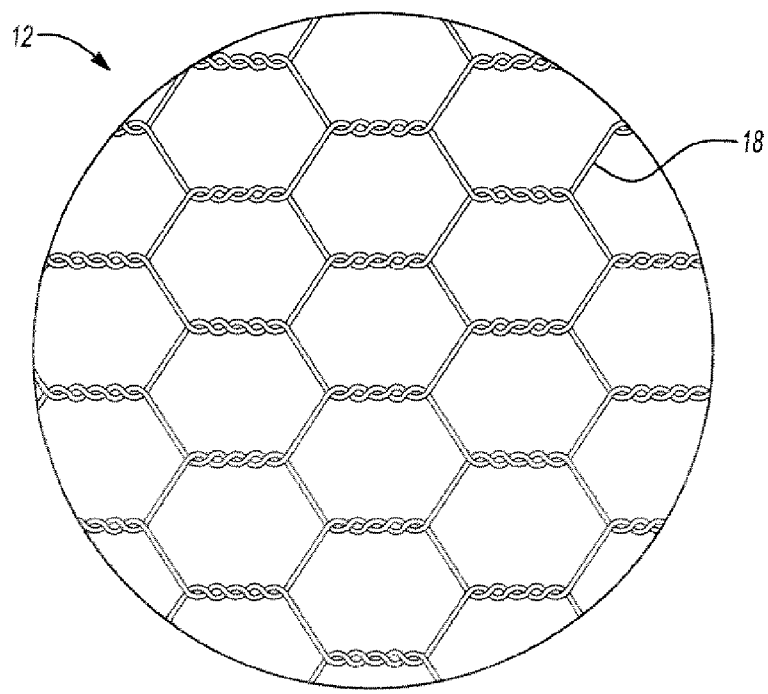
FIG. 2 is a front view of an exemplary carrier material according to another aspect of the present invention.
Figure 3:
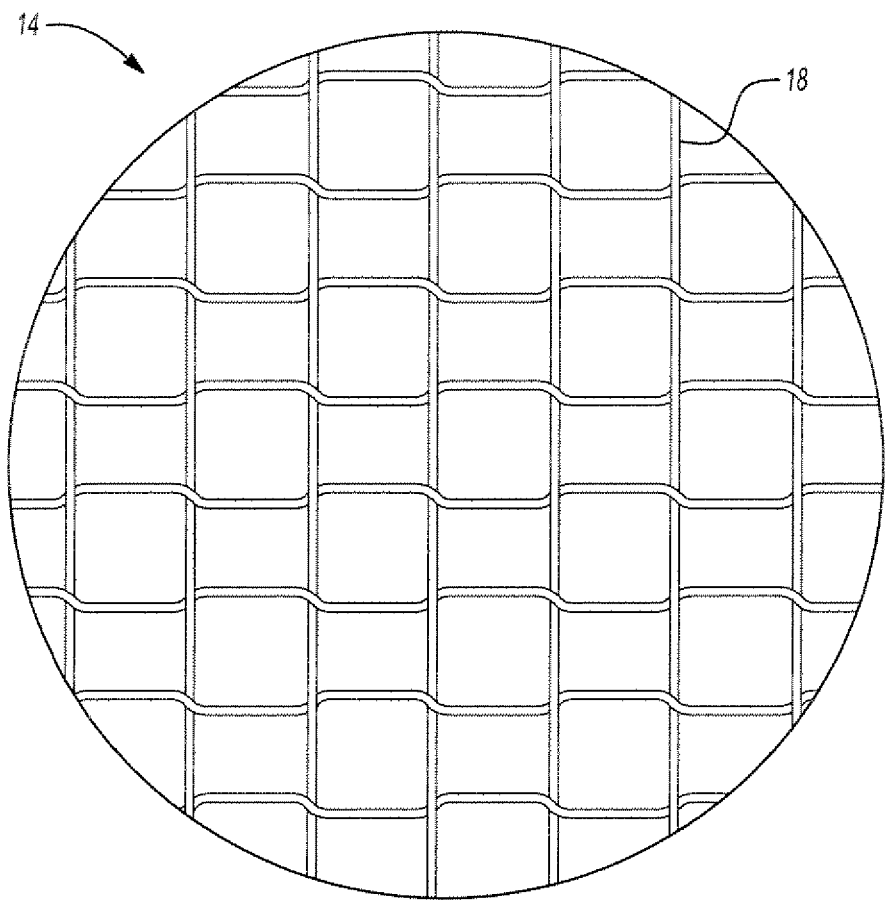
FIG. 3 is a front view of an exemplary carrier material according to another aspect of the present invention

Referring to FIGS. 1-3, there are illustrated examples of suitable carrier materials 10, 12 and 14 suitable for use in the present invention. Each of the materials includes a plurality (e.g., 2, 3, 4, 5 or more) of strips 18 intertwined (e.g., interwoven) with each other to form the materials 10, 12 and 14. In FIG. 1, the carrier material 10 includes a plurality of interwoven strips 18 (e.g., wires). The carrier material 12 of FIG. 2 includes a plurality of strips 18 (e.g., wires) configured into a honeycomb arrangement. Moreover, the carrier material 14 of FIG. 3 includes a plurality of strips 18 (e.g., wires) arranged to form relatively large openings 20 and relatively small openings 22. Generally, wire mesh and particularly metal or plastic wire mesh products may be employed as carrier materials.

For forming a member according to the present invention, an activatable material is typically associated with (e.g., connected to, dispose upon, surrounding or the like) the carrier material. The carrier material may be formed into a carrier before or after the activated material is associated with the carrier material. For example, carrier material may be cut to form a carrier of desired shape and the activatable material may be associated with the carrier thereafter. Alternatively, activatable material may be associated with the carrier material followed by cutting or otherwise forming the carrier material to for the carrier.

As used for the present invention, the term activatable material is intended to mean a material that can be activated to cure (e.g., thermoset), expand (e.g., foam), soften, flow or a combination thereof upon exposure to a condition. Thus, it is contemplated for the present invention that an activatable material may be activated to perform only one of aforementioned activities or any combination of the aforementioned activities unless otherwise stated.

A variety of activatable materials may be used for the member of the present invention. In one embodiment, the activated material may be formed of a heat activated material and may flow, cure (e.g., thermoset), expand (e.g., foam) or a combination thereof upon exposure to heat. The activatable material may be generally dry to the touch and substantially non-tacky or may be tacky and, in either situation, may be shaped in any form of desired pattern, placement, or thickness, and may have substantially uniform thickness or variable thickness. Exemplary expandable materials include L-7102 and L-7220 foams available through L&L Products, Inc. of Romeo, Mich. Another exemplary expandable material is disclosed in U.S. patent application titled "Expandable Material", Ser. No. 10/867,835, filed on Jun. 15, 2004 and incorporated herein by reference for all purposes.

Though other heat-activated materials are possible, a preferred heat activated material is an expandable polymer or plastic, and preferably one that is foamable. Particularly preferred materials are foamable or sealing materials, which include or are based upon an EPDM, an elastomer an epoxy resin, an acrylate or an acetate combinations thereof or the like, which may be structural, sealing, baffling, acoustic or a combination thereof. For example, and without limitation, the foam may be an epoxy-based material, including an ethylene copolymer or terpolymer that may possess an alpha-olefin. As a copolymer or terpolymer, the polymer is composed of two or three different monomers, i.e., small molecules with high chemical reactivity that are capable of linking up with similar molecules.

A number of sealing, baffling or acoustic foams are known in the art and may be employed in the present invention. A typical foam includes a polymeric base material, such as an epoxy resin or ethylene-based polymer (e.g. EMA, EVA or the like) which, when compounded with appropriate ingredients (typically a blowing and curing agent), expands and cures in a reliable and predicable manner upon the application of heat or the occurrence of a particular ambient condition. From a chemical standpoint for a thermally-activated material, the foam is usually initially processed as a flowable thermoplastic and/or a thermosettable material. Typically, the material will cross-link (e.g. thermoset) upon curing, which makes the material incapable of further flow.

One advantage of the preferred foamable or activatable materials over prior art materials is that the preferred materials can be processed in several ways. The preferred materials can be processed by injection molding, extrusion, compression molding or with a mini-applicator. This enables the formation and creation of part designs that exceed the capability of most prior art parts.

While preferred materials have been disclosed, other materials may be used as well, particularly materials that are heat-activated or otherwise activated by an ambient condition (e.g. moisture, pressure, time, chemical reaction or the like) and cure in a predictable and reliable manner under appropriate conditions for the selected application. Of course, the material may also be formed of non-curable materials, nonexpandable materials or otherwise. Thus, upon activation, the material may soften, cure and expand; soften and cure only; cure only; soften only; or may be non-activatable.

One example of an expandable material is the epoxy based resin material disclosed in U.S. Pat. No. 6,131,897, the teachings of which are incorporated herein by reference. Some other possible materials include, but are not limited to, polyolefin materials, copolymers and terpolymers with at least one monomer type an alpha-olefin, phenol/formaldehyde materials, phenoxy materials, and polyurethane materials with high glass transition temperatures. See also, U.S. Pat. Nos. 5,766,719; 5,755,486; 5,575,526; and 5,932,680, (incorporated by reference). Polyurethane materials including a blocked isocyanate may also be employed. In general, the desired characteristics of the material include high glass transition temperature (typically greater than 70 degrees Celsius), and adhesion durability properties, In this manner, the material does not generally interfere with the materials systems employed by automobile manufacturers.

Other exemplary expandable materials can include combinations of two or more of the following: epoxy resin, polystyrene, styrene butadiene-styrene (SBS) block copolymer, butadiene acrylo-nitrile rubber, amorphous silica, glass microspheres, azodicarbonamide, urea, dicyandiamide. Examples of such materials are sold under the tradename SIKAELASTOMER, SIKAREINFORCER and SIKABAFFLE and are commercially available from the Sika Corporation, Madison Heights, Mich.

In applications where the material is a heat activated, thermally expanding material, an important consideration involved with the selection and formulation of the material comprising the foam is the temperature at which a material reaction or expansion, and possibly curing, will take place. Typically, the foam becomes reactive at higher processing temperatures, such as those encountered in an automobile assembly plant, when the foam is processed along with the automobile components at elevated temperatures or at higher applied energy levels, e.g., during paint, primer or e-coat baking or curing steps. While temperatures encountered in an automobile assembly operation may be in the range of about 148.89° C. to 204.44° C. (about 300° F. to 400° F.), body and paint shop applications are commonly about 93.33° C. (about 200° F.) or slightly higher. If needed, blowing agent activators can be incorporated into the composition to cause expansion at different temperatures outside the above ranges. Generally, suitable expandable foams have a volumetric range of expansion ranging from approximately 0 to over 1000 percent (e.g., volumetric expansion of greater than 50%, 100%, 200% or 500% of the original unexpanded volume of the material).

The material or medium may be at least partially coated with an active polymer having damping characteristics or other heat activated polymer, (e.g., a formable hot melt adhesive based polymer or an expandable structural foam, examples of which include olefinic polymers, vinyl polymers, thermoplastic rubber-containing polymers, epoxies, urethanes or the like) placed along the mold through the use of baffle technology; a die-cast application according to teachings that are well known in the art; pumpable application systems which could include the use of a baffle and bladder system; and sprayable applications.

Formation

Generally, formation of the member of the present invention can be accomplished using multiple different techniques such an extrusion, molding (e.g., compression molding, injection molding, blow molding or the like), machining, combinations thereof or the like. Such formation generally includes associating one or more masses of activatable material with the carrier and/or carrier material. The activatable material can be connected or attached directly or indirectly to the carrier. Typically, however, the activatable material is disposed about (i.e., surrounds) a substantial portion of the carrier. In such an embodiment, it is typically desirable of the activatable material to surround at least 30%, but possibly less, more typically at least 50% and even more typically at least 80% and still more typically at least 90 or even 100 percent of the carrier.

According to one preferred embodiment, the activatable material is injection molded about the carrier. In such embodiment, a carrier material is formed (e.g., cut) to a desired shape and/or size for forming the carrier. The carrier is then placed in a mold of an injection molding machine and the mold is closed about the carrier. Activatable material is injected into the mold in a substantially fluid state and allowed to substantially surround and adhere to the carrier. Then the member including the carrier and the activatable material are removed from the mold.

Figure 4:
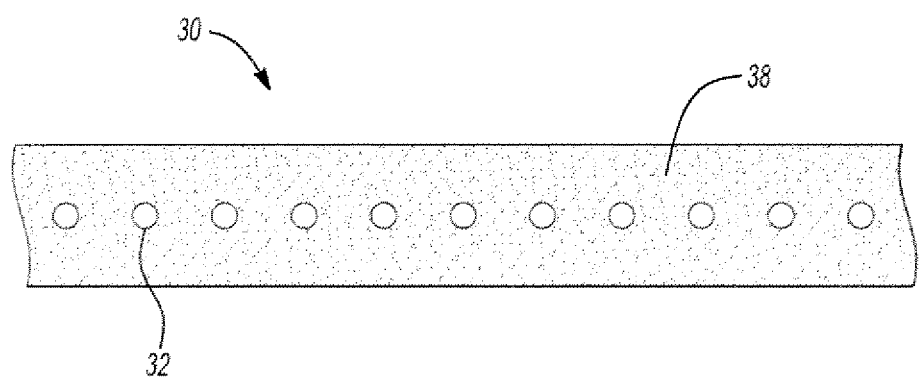
FIG. 4 is a sectional view of an exemplary member according to an aspect of the present invention.
Figure 5:
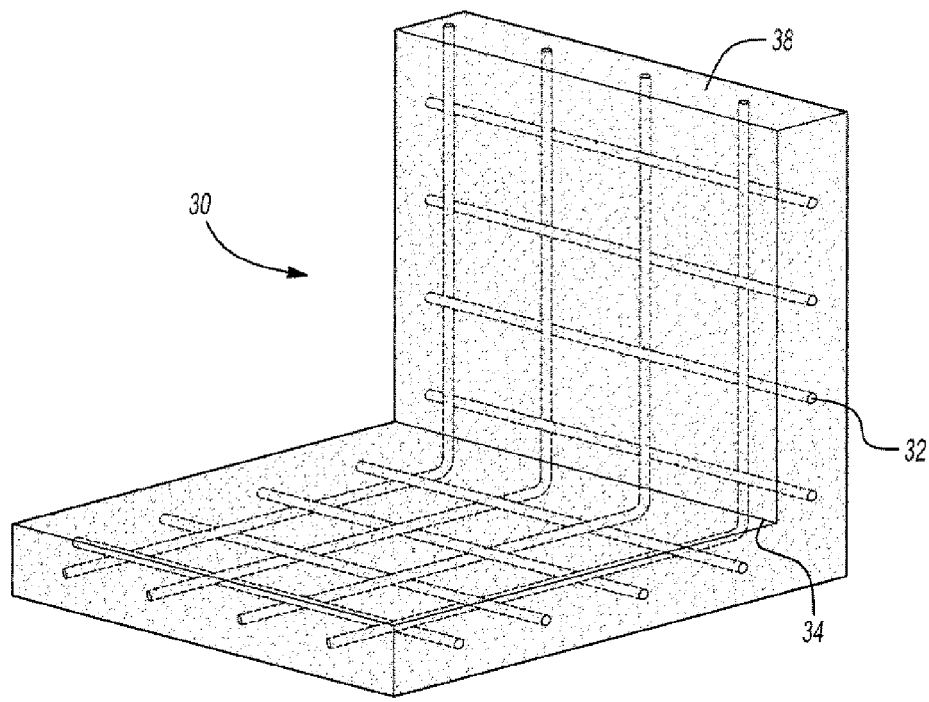
FIG. 5 is a perspective view of an exemplary member according to an aspect of the present invention.

In FIGS. 4 and 5, there is illustrated a member 30 that can be formed using injection molding. For forming the member 30, a carrier 32 is cut from carrier material into a rectangular shape. The carrier 32 is then placed in a mold of an injection molding machine and the mold is closed. If the carrier 32 does not include a bend 34 as shown in FIG. 5, once cut, the bend may be preformed prior to insertion of the carrier 32 in the mold or the bend 34 may be formed upon closing of the mold. Thereafter, activatable material 38 is injected into the mold about the carrier at an elevated temperature (e.g., a temperature that is typically greater than 30°, 40°, 60°, 80°, or even 100° C. but typically less than 220°, 120°, 100°, or even 70° C.) that maintains the activatable material 38 in a relatively fluid state but does not substantially activate the material 38. The activatable material is then allowed to cool such that it adheres to the carrier 32 thereby forming the member 30.

According to one preferred embodiment, the activatable material is extruded or co-extruded about the carrier or carrier material. In such embodiment, a carrier material is preferably fed to an extrusion die along with activatable material that is exiting an extruder thereby forming a composite extrudate. In this manner, activatable material can substantially surround the carrier material. Thereafter, the extrudate including the carrier material, the activatable material or both can be cut to a desired shape or configuration to form a member such as the member 30 shown in FIG. 5. Preferably, although not required, the activatable material 38 is extruded at an elevated temperature (e.g., a temperature that is typically greater than 30°, 40°, 60°, 80°, or even 100° C. but typically less than 220°, 170°, 120°, 100°, or even 70° C.) that maintains the activatable material 38 in a relatively fluid or viscoelastic state but does not substantially activate the material 38. Then, upon cooling, the activatable material can cool such that it adheres to the carrier 32 thereby forming the member 30.

Advantageously, formation of members using these techniques can provide the member with relatively complex or simple shapes and/or contours as needed or desired. Moreover, the carriers of the members assist the members in maintaining these shapes and particularly assist the activatable material in maintaining its shape.

In any of the embodiments of the present invention, but particularly in situations where the carrier serves primarily to support the activatable material, it is preferable for the volume of the activatable material to be substantially greater than the volume of the carrier. For example, the volume of the activatable material can be at least 200%, more typically at least 500% and even more typically at least 800% the volume of the carrier. As an exemplary calculation, 200% of a volume of 10 m³ is 20 m³.

It is additionally contemplated that a member according to the present invention can include one or more fasteners such as adhesive, mechanical fasteners magnets or the like for assisting in assembly the member to a structure of an article of manufacture (e.g., an automotive vehicle). Such fasteners may be integrally formed (e.g., molded) of the same material as the carrier, the activatable material or both. Alternatively, the one or more fasteners may be formed and separately attached to the member. As one example, a portion of the activatable material may be injection molded to extend outwardly from the member such that the portion may be interference fit into an opening of a structure of an article of manufacture. Alternatively, a portion of the carrier may extend outwardly from the member and be attachable in the same manner. As still another alternative, a separate fastener such as two-side tape, a magnet or a push-pin or other mechanical fastener may be attached to the member and then the fastener can be attached (e.g., adhered, magnetized or interference fit) to a structure of an article.

Application

A member according to the present invention may be applied to a variety of locations upon various structures a variety of articles of manufacture. Generally, a member in accordance with the present invention is quite suitable for application to a structure defining an internal cavity. In such a circumstance, the member can be placed within the cavity and the activatable material of the member can be activated, upon exposure to a condition such as heat (e.g., in an e-coat, primer or paint bake oven), to expand and/or adhere to walls of the structure defining the cavity for providing baffling, sealing or reinforcement to the structure.

Figure 6:
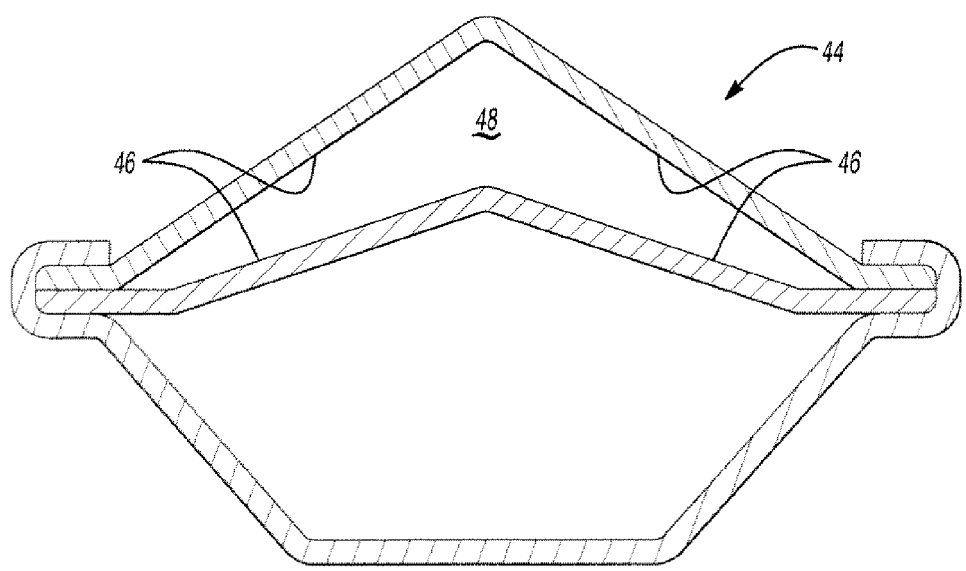
FIG. 6 is a sectional view of an exemplary structure according to an aspect of the present invention.

The member of the present invention has been found particularly suitable for application to structures of automotive vehicles. As can be seen in FIG. 6, there is illustrated a structure 44 (e.g., a pillar) of an automotive vehicle wherein the structure 44 includes walls 46 defining an internal cavity 48. For exemplary purposes, the shape of the member 30 of FIG. 5 is such that it contours correspond to the shape of the cavity 48 of the structure 44 of FIG. 6. Thus, the member 30 can be placed in the cavity 48 with a relatively small clearance (e.g., less than 2.5 cm, more typically less than 1.0 cm and even more typically less than 0.4 cm and still more typically less than 0.2 cm) between the outer periphery of the member and that walls 46 defining the cavity 48. Of course, the member may also be substantially smaller than the cavity.

After placement of the member 30 in the cavity 48, the activatable material is activated to expand (e.g., foam), cure (thermoset) and adhere to the walls 46 of the structure 44. If the member 30 is designed to provide baffling, sealing and/or noise reduction to the structure 44, the activatable material will typically expand to a volume that is at least 500%, although possibly less, more typically at least 800% and even more typically at least 1400% its original unexpanded volume such that the member and particularly the activated material (e.g., foam) substantially entirely span a cross-section of the cavity 48. If the member is designed for reinforcement, the activatable material will typically expand to a volume at least 5%, although possibly not at all, but typically less than 600%, more typically less than 400% and even more typically less than 250% its original unexpanded volume. Of course, the member could provide a combination of baffling, sealing and reinforcement to the structure such that it does any combination of the aforementioned. Moreover, the member could include two or more different activatable materials to assists in providing a combination of the aforementioned functional attributes.

Alternative Embodiments

FIGS. 7 and 8 illustrate a different embodiment of a member 50 according to the present invention. It will be understood that the features of the member 50 of FIGS. 7 and 8 can be employed in addition to or as alternatives to the previously described embodiments and the features of the previous embodiment can be employed with the member 50 of FIGS. 7 and 8. The member 50 of FIGS. 7 and 8 includes a malleable carrier 52, activatable material 54 disposed about and substantially surrounding the carrier 52 and, optionally, one or more fasteners 58.

The malleable carrier 52 can be provided as an elongated strip having a plurality of widened portions 60 with a plurality (e.g., 2, 3 or more) of openings 62 (e.g., through-holes) extending into and or through the carrier 52. The carrier 52 can be formed of any of the materials discussed herein as suitable malleable carriers.

The fasteners 58 are illustrated as mechanical fasteners and more particularly push-pins. The fasteners 58 can be attached to (e.g., adhered to, interferingly fit with) the carrier 52, the activatable material or both. In the embodiment shown, the fasteners 58 are interferingly fit to the carrier 52 by extending an elongated portion 64 of each of the fasteners 58 respectively through the openings 62 of the carrier.

The activatable material 54 can be any of the activatable materials discussed herein and can be injection molded, extruded or otherwise shaped about and/or applied to the carrier 52. Preferably, although not required, the activatable material is shaped about the carrier 52 and at least a portion of the one or more fasteners 58 as in the illustrated embodiment.

The member 50 may be applied to a structure of an article of manufacture according to a variety of techniques. As one example, the fasteners 58 of the member 50 may be interference fit into openings (e.g., through holes) of a structure of an automotive vehicle (e.g., a pillar such as that illustrated in FIG. 6) such that the activatable material is located in a cavity of the structure. As an alternative, the fasteners 58 may be interference fit into openings of a secondary carrier and the secondary carrier along with the member 50 may be placed in a cavity of a structure.

Advantageously, the malleable carrier 52 allows the member to be shaped (e.g., bent or curved) during application to accommodate contours of a structure or a secondary carrier thereby allowing the member to be more easily attached thereto. As shown in FIG. 8A, the member 50 is applied to a contoured or curved substrate 66 (e.g., a structure or secondary carrier) and the member 50 is curved or contoured to accommodate the curved or contoured surface of the substrate 66. Preferably, after location within a cavity, the activatable material can be activated as previously described to provide reinforcement, baffling or sealing to the structure.

Figure 9:
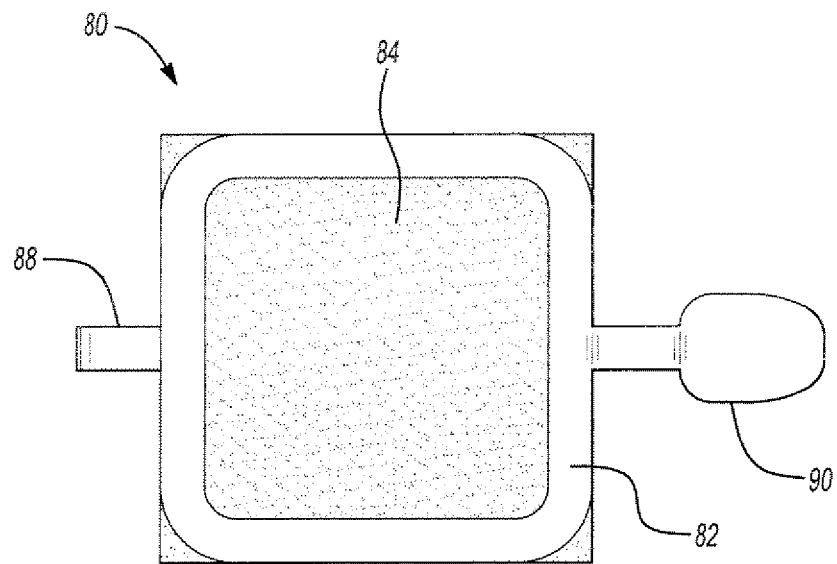
FIG. 9 is a front view of an exemplary member according to an aspect of the present invention.
Figure 10:
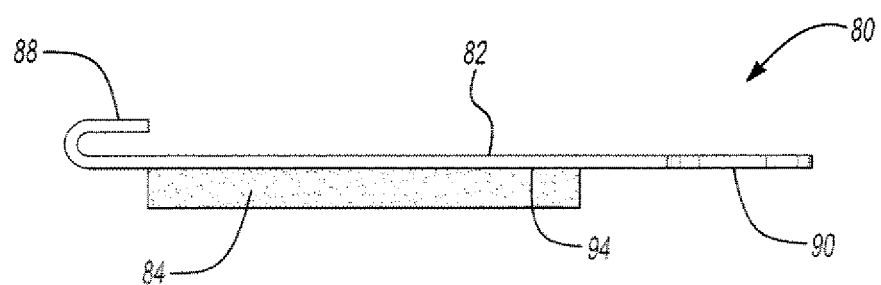
FIG. 10 is side view of the exemplary member of FIG. 9.

FIGS. 9 and 10 illustrate a different embodiment of a member 80 according to the present invention, It will be understood that the features of the member 80 of FIGS. 9 and 10 can be employed in addition to or as alternatives to the previously described embodiments and the features of the previous embodiment can be employed with the member 80 of FIGS. 9 and 10. The member 80 of includes a malleable carrier 82, activatable material 84 disposed upon and or about the carrier 82 and, optionally, one or more fasteners 88, 90.

The malleable carrier 82 can be provided as a frame (shown as rectangular) formed of an elongated strip. The carrier 82 can be formed of any of the materials discussed herein as suitable malleable carriers.

The fasteners 88, 90 are illustrated as mechanical fasteners and more particularly as tabs, which are preferably bendable and are integrally formed of the same material as the carrier 82. As shown, a first fastener 88 extends from one side of the carrier 82 and a second fastener 90 extends from an opposite side of the carrier 82. The first fastener 88 is generally hook-shaped.

The activatable material 84 can be any of the activatable materials discussed herein and can be manually, automatically or otherwise applied to the carrier 82. If the activatable material 84 is tacky, it may be desirable to cover one or more surface of the material with release paper that can be removed from the material just prior to application of the member 80 to a structure. In the illustrated embodiment, the activatable material 84 has a shape (e.g., rectangular) corresponding generally to the shape of the carrier 82 and the material 84 is adhered to at least one surface 94 of the carrier 82.

Figure 11:
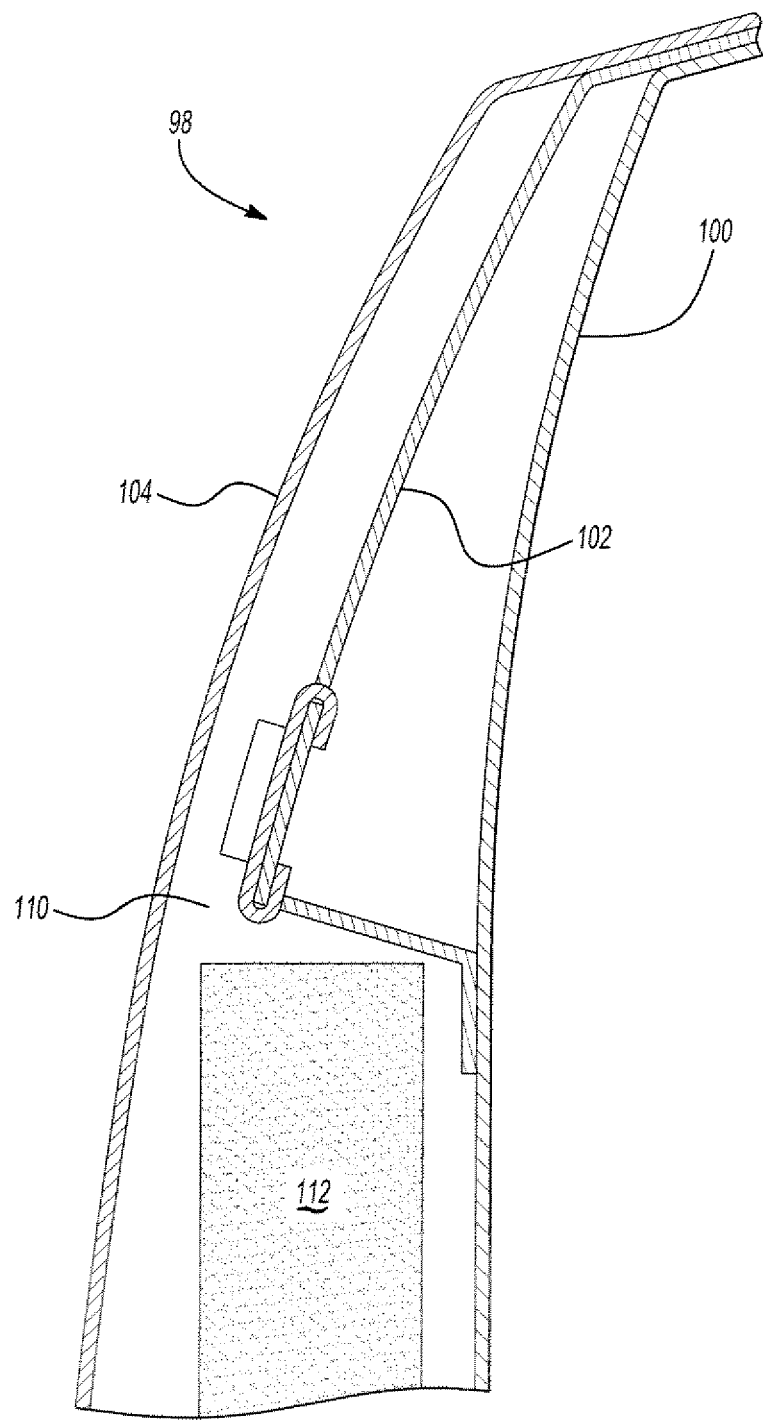
FIG. 11 is a side view of the exemplary member of FIGS. 9 and 10 applied to an exemplary structure of an automotive vehicle.

The member 80 may be applied to a structure of an article of manufacture according to a variety of techniques. In FIG. 11, the member is applied to a pillar structure 98 of a vehicle. As shown, the pillar structure 98 includes a first member 100 shown as a body side inner, a second member 102 shown as a body side reinforcement and a third member 104 shown as a body side outer. The member 80 is attached to the second member 102 of the structure 98 by extending the first fastener 88 through an opening in the member 102 and hooking the first fastener 84 onto an edge of the second member 102. Thereafter, the second fastener 90 is bent around and hooked onto an edge at a distal end of the second member 102 by bending the second fastener 90 about the edge for at least temporarily fastening the member 80 to the structure 98 and particularly the second member 102.

Preferably, after location within a cavity, the activatable material can be activated as previously described to provide reinforcement, baffling or sealing to the structure. In the particular embodiment illustrated, the member 80 is activated within a cavity 110 defined between the first member 100 and the third member 104 and the activatable material can be activated to, not only provide reinforcement (e.g., against buckling) to the structure 98, but also to provide a relatively strong reinforced connection between two reinforcements such as the second member 102 and a lower reinforcement 112 for the structure 98.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

What is claimed is:

1. A process of forming a member for reinforcing a structure of an automotive vehicle, the process comprising:
providing a malleable carrier in the form of a singular elongated strip, the carrier being formed of plastic or metal;
molding an activatable material about the malleable carrier such that the activatable material substantially entirely surrounds the carrier for forming the member prior to expansion and wherein the malleable carrier includes a plurality of widened portions with one of a plurality of through-holes through each of the widened portions;
extending a plurality of fasteners through the plurality of through-holes, wherein the activatable material is molded about at least a portion of the plurality of fasteners and the activatable material is generally dry and substantially non-tacky.

2. A process as in claim 1 wherein the malleable carrier has a yield stress less than about 700 MPa and greater than about 100 MPa.

3. A process as in claim 1 wherein the malleable carrier is formed of a wire mesh.

4. A process as in claim 1, wherein the member is attached to a structure or secondary carrier and wherein attaching of the member includes shaping the member including the malleable carrier and the activatable material to accommodate one or more contours of the structure or secondary carrier.

5. A process as in claim 4 wherein shaping includes bending or curving of the member.

6. A process as in claim 4 wherein the malleable carrier is formed of metal and has a yield stress less than about 700 MPa and greater than about 100 MPa.

7. A process as in claim 4 wherein shaping includes bending or curving of the member and wherein the activatable material is a heat activated thermosetting material that foams, expands and cure upon exposure to temperature in an e-coat or bake oven.

8. A process as in claim 1 including
attaching the member to a secondary carrier that is larger than the malleable carrier wherein attaching of the member includes shaping of the member including the malleable carrier and the activatable material to accommodate one or more contours of the secondary carrier and extending the plurality of fasteners through the plurality of through-holes wherein the attaching of the member includes attaching the fasteners to the secondary carrier.

9. A process as in claim 1, wherein the member is attached to a secondary carrier by engaging each of the plurality of fasteners in an interference fit with a plurality of openings located along a secondary carrier or vehicle structure.

10. A process as in claim 1, wherein the plurality of fasteners are push-pins.

11. A process as in claim 1, wherein the plurality of fasteners are flexible tabs.

12. A process as in claim 11, wherein the plurality of fastener are integrally formed with the malleable carrier.

13. A process as in claim 1, wherein any maximum diameter of the malleable carrier is less than 10% of any extension length of the malleable carrier.

14. A process as in claim 1, wherein the malleable carrier is cut and formed before the activatable material is located onto the carrier.

15. A process as in claim 1, wherein the activatable material is an epoxy-based material.

16. A process as in claim 1, wherein the activatable material surrounds at least 90% of the carrier.

17. A process as in claim 1, wherein the activatable material surrounds 100% of the carrier.

18. A process as in claim 17, wherein the activatable material cools after the injection molding or extrusion process and adheres to the malleable carrier.

19. A process as in claim 1, wherein the activatable material is injection molded or extruded about the carrier.

20. A process as in claim 1, wherein the volume of the activatable material is at least about 500% of the volume of the malleable carrier.

21. A process as in claim 1, wherein the member is attached to a pillar structure of a vehicle.

* * * * *

UNITED STATES PATENT AND TRADEMARK OFFICE
CERTIFICATE OF CORRECTION

| | | |
|---|---|---|
| PATENT NO. | : 8,763,254 B2 | Page 1 of 1 |
| APPLICATION NO. | : 13/298901 | |
| DATED | : July 1, 2014 | |
| INVENTOR(S) | : Gray et al. | |

It is certified that error appears in the above-identified patent and that said Letters Patent is hereby corrected as shown below:

In the Claims

Column 10, Line 56, Claim 12, delete "plurality of fastener" and insert --plurality of fasteners--

Signed and Sealed this
Twenty-first Day of October, 2014

Michelle K. Lee
*Deputy Director of the United States Patent and Trademark Office*